(12) United States Patent
Chen et al.

(10) Patent No.: US 8,586,486 B2
(45) Date of Patent: Nov. 19, 2013

(54) METHOD FOR FORMING SEMICONDUCTOR DEVICE

(75) Inventors: Jen-Yi Chen, Linnei Township, Yunlin County (TW); Kun-Ei Chen, Beimen Township, Tainan County (TW); Ling-Sung Wang, Tainan (TW); Chen-Chieh Chiang, Kaohsiung (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 41 days.

(21) Appl. No.: 13/327,947

(22) Filed: Dec. 16, 2011

(65) Prior Publication Data

US 2013/0157467 A1 Jun. 20, 2013

(51) Int. Cl.
*H01L 21/31* (2006.01)

(52) U.S. Cl.
USPC ................................. 438/788; 257/E21.249

(58) Field of Classification Search
USPC .......................................... 438/786, 788, 791
See application file for complete search history.

(56) References Cited

U.S. PATENT DOCUMENTS

| | | | |
|---|---|---|---|
| 6,335,249 B1 * | 1/2002 | Thei et al. | 438/296 |
| 6,620,560 B2 * | 9/2003 | Jiang et al. | 430/5 |
| 6,800,558 B1 | 10/2004 | Chang et al. | |
| 6,821,896 B1 | 11/2004 | Shih | |
| 6,861,376 B1 | 3/2005 | Chen et al. | |
| 7,015,136 B2 | 3/2006 | Bao et al. | |
| 7,820,553 B2 * | 10/2010 | Chu et al. | 438/711 |
| 2008/0176374 A1 * | 7/2008 | Jon et al. | 438/301 |
| 2011/0174774 A1 | 7/2011 | Lin et al. | |

* cited by examiner

*Primary Examiner* — Charles Garber
*Assistant Examiner* — Reema Patel
(74) *Attorney, Agent, or Firm* — Duane Morris LLP

(57) ABSTRACT

A method of patterning a material layer of a semiconductor device is disclosed, the method including treating a material layer above a semiconductor substrate with plasma oxygen; depositing a layer of photoresist over a first surface of the material layer after the treating of the material layer; patterning the layer of photoresist, thereby forming a patterned photoresist, exposing portions of the material layer; etching the exposed portions of at least the material layer to form at least one contact via in the material layer extending to a source or drain region of a device at a surface of the substrate; and removing the patterned photoresist from the first surface of the material layer.

12 Claims, 3 Drawing Sheets

US 8,586,486 B2

METHOD FOR FORMING SEMICONDUCTOR DEVICE

FIELD

The present disclosure relates to a method of reducing or preventing formation of photoresist scum in a patterned photoresist.

BACKGROUND

Semiconductor devices are used in a variety of electronic applications, such as personal computers, cell phones, digital cameras and other electronic equipment. Semiconductor devices are typically fabricated by sequentially depositing insulating or dielectric layers, conductive layers, and semiconductive layers of material over a semiconductor substrate, and patterning the various layers using lithography to form circuit components and elements thereon.

Salicide technology is used to form electrical contacts between the semiconductor device and the supporting interconnect structure. The salicide process involves the reaction of a thin metal film with silicon in the active regions of the device, forming a metal silicide contact through a series of annealing and/or etch processes. Salicide formation takes place at the boundary of the front end of line (FEOL) and back end of line (BEOL). Silicide lowers the sheet resistance of the polysilicon and active silicon regions. The self-aligned silicide (salicide) relies on the principle that metal silicide will typically not form over dielectric materials, e.g., silicon nitride. Thus a metal, e.g., titanium or cobalt can be deposited over the entire surface of the wafer, and then annealed to selectively form silicide over exposed polysilicon and silicon.

The salicide process begins with deposition of a thin transition metal layer over fully formed and patterned semiconductor devices (e.g., transistors). The wafer is heated, allowing the transition metal to react with exposed silicon in the active regions of the semiconductor device (e.g., source, drain, gate), forming a low-resistance transition metal silicide. The transition metal does not react with the silicon dioxide or the silicon nitride insulators present on the wafer. Following the reaction, any remaining transition metal is removed by chemical etching, leaving silicide contacts in only the active regions of the device.

A problem in FEOL processing in dielectric materials is the formation of photoresist scum on the sidewalls and the bottom surfaces of the contact vias. The photoresist scum may cause the formation of oxides in undesired regions within the contact via, resulting in increased resistance of the contact via. Lengthy cleaning processes may be performed in an attempt to remove the photoresist scum from within the contact via. Photoresist scum increases the cost of manufacturing and may decrease product yields.

Thus, improved methods of eliminating or preventing photoresist scum are desired in semiconductor device manufacturing.

DETAILED DESCRIPTION

Figure 1:
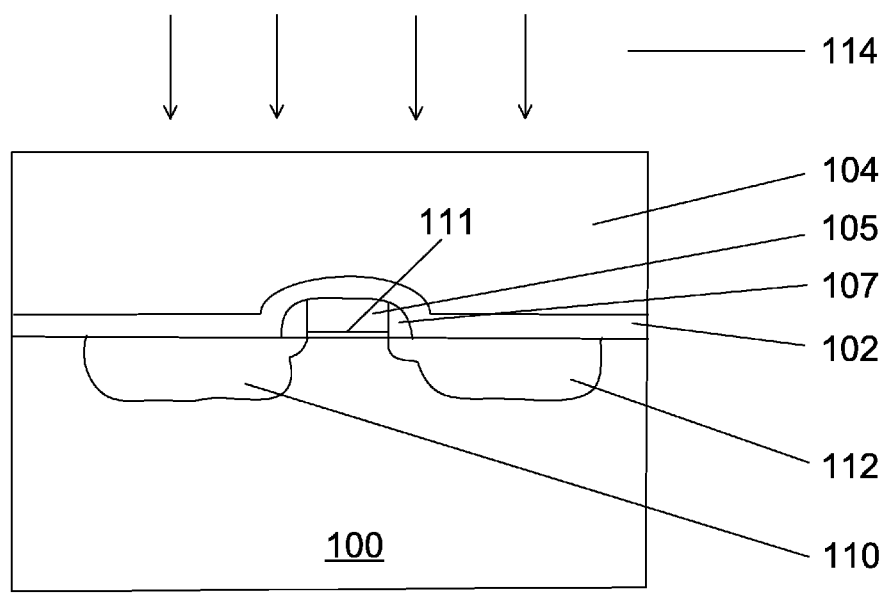
FIG. 1 is a cross-section of an embodiment, wherein a treatment is introduced to prevent the formation of photoresist scum in a contact via.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

A problem in FEOL processing in dielectric materials is that photoresist scum may form on the sidewalls and bottom surface of the contact via. The photoresist scum tends to form contaminants that may emit from material layers disposed over the substrate, such as the etch stop layer. For instance, the etch stop layer may comprise SiC or tetra ethyl oxysilane (TEOS), which may release $NH_x$ that rises upwards (e.g., through the insulating layer) toward the contact via pattern sidewalls and bottom surface during the etch process, reacting with the photoresist particles that may be released during the etch process. The photoresist scum may comprise a polymer including the $NH_x$ and photoresist, for example. The photoresist may comprise an acid and the $NH_x$ may comprise a base.

The reaction may be represented by: $3CH_3$—Si—H+ $NH_3 => NH_x + 3SiC$

The oxide material/residue or insulative contaminant in the contact via is problematic, because a reduced electrical connection is made to the underlying source/drain regions and gate electrode (e.g., polycrystalline silicon), thus increasing the resistance of the contact via or the electrical connection of the contact via to the source/drain region and gate electrode. The insulative contaminant forms in the contact via as a result of the photoresist scum, which results in a decreased area of the conductive material of the contact via making contact with an underlying source or drain diffusion region and/or gate electrode and thus causing increased resistance of the contact via. In extreme cases, no electrical connection may be made by the contact via to the underlying source or drain diffusion region and/or gate electrode, resulting in a device failure, and the semiconductor device is not useable. The insulative contaminant may comprise an oxide residue that can increase resistance and impair the performance and/or reliability of the contact.

Photoresist scum causes manufacturing yields to decrease and causes a decrease in semiconductor device performance. Photoresist scum also causes an increase in the cost of manufacturing of semiconductor devices.

In the photolithography method, nitrogen reacts with and contaminates the photoresist. Thus, during the development procedure, $NH_x$ photoresist scum remains, in turn forming an inaccurate pattern and affecting the electrical properties of the device. The nitrogen source is derived from silicon oxynitride (SiON) material of the anti-reflective layer (ARL) and the silicon nitride or silicon carbon nitride (SiCN) material of the etching stop layer.

In accordance with some embodiments, a method of patterning a material layer of a semiconductor device includes treating a material layer above a semiconductor substrate with plasma, depositing a layer of photoresist over the material layer after the treating of the material layer, patterning the layer of photoresist, thereby forming a patterned photoresist, exposing portions of the material layer, etching the exposed portions of at least the material layer to form at least one contact via in the material layer extending to a source or drain region 110, 112 and/or gate electrode 105 of a device at a surface of the substrate, and removing the patterned photoresist from the first surface of the material layer.

In some embodiments, the plasma is an oxygen plasma, but in other embodiments, the plasma may include oxygen and other ions. In accordance with another embodiment, a method of fabricating a semiconductor device includes providing a substrate, depositing an insulating material layer over the substrate, treating the material layer with plasma oxygen, and depositing a layer of photoresist over a first surface of the insulating material layer after the treating of the insulating material layer. In embodiments, the processing time range is from about 1-200 seconds, and the depth of $O_2$ ions is at least about 0.1 nm. The layer of photoresist is patterned, thereby forming a patterned photoresist, exposing portions of the insulating material layer. The exposed portions of at least the insulating material layer are etched away to form contact vias in at least the insulating material layer extending to a source or drain region 110, 112 or gate electrode 105 of a device at a surface of the substrate 10. The patterned photoresist 203 is then removed from the first surface of the insulating material layer 204. In various embodiments, this plasma treatment may be used for contacts to other devices besides transistors, such as diodes, varactors, etc.

In accordance with yet another embodiment, a method of forming at least one contact via of a semiconductor device includes providing a substrate having an insulating material layer formed thereon, treating the material layer with plasma oxygen, depositing a layer of photoresist over a first surface of the insulating material layer after the treating of the insulating material layer, patterning the layer of photoresist with a pattern for at least one contact via, and patterning at least the insulating material layer using the layer of photoresist as a mask to form at least one contact via in at least the insulating material layer extending to a source or drain region of a device at a surface of the substrate. The layer of photoresist is removed, and a conductive material is deposited within the at least one contact via in the insulating material layer, wherein the conductive material within the at least one contact via comprises the at least one contact via.

Advantages of some embodiments include preventing the formation of photoresist scum in semiconductor device patterning processes. Manufacturing yields and device performance are improved, and the cost of manufacturing is decreased, by the use of embodiments.

The foregoing has outlined rather broadly certain features, so that the detailed description may be better understood. Additional features and advantages of embodiments are described below. It should be appreciated by those skilled in the art that the conception and specific embodiments disclosed may be readily utilized as a basis for modifying or designing other structures or processes.

FIG. 1 shows a substrate 100 having a device (e.g., a transistor) formed thereon. The substrate 100 can be a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, according to various exemplary embodiments. The source/drain regions 110, 112 are provided by doping a region of the bulk substrate 100 with impurities.

An insulating layer 111 is provided above the channel region between the source/drain regions 110, 112. In some embodiments, a silicon oxide gate insulating layer 111 is provided. In other embodiments, the insulating layer 111 comprises a high-K dielectric 111, such as, but not limited to, a hafnium based oxide, a hafnium based oxynitride, or a hafnium-silicon oxynitride, hafnium silicate, zirconium silicate, hafnium dioxide and zirconium dioxide. The high-k dielectric layer 111 may include a binary or ternary high-k film such as HfO, LaO, AlO, ZrO, TiO, $Ta_2O_5$, $Y_2O_3$, STO, BTO, BaZrO, HfZrO, HfLaO, HfTaO, HfTiO, combinations thereof, or other suitable materials. Alternatively, the high-k dielectric layer 111 may optionally include a silicate such as HfSiO, LaSiO, AlSiO, combinations thereof. The insulating layer 111 may be deposited using atomic layer deposition.

The gate electrode 105 may be formed of polycrystalline silicon. In other embodiments the gate electrode 105 may be a metal or alloy, such as but not limited to, titanium nitride, tantalum nitride, or aluminum nitride. Gate electrodes formed from any of these materials are sometimes referred to as the "poly layer". Sidewall spacers 107, are formed of a dielectric material, for forming lightly doped drain (LDD) regions.

In FIG. 1, a passivation layer 102 such as silicon nitride (SiN) or silicon carbon nitride and a dielectric layer 104 such as silicon oxynitride are formed in sequence, above gate electrode 105 and spacers 107 on a substrate 100. The material in these layers, e.g., SiN, induces photoresist scum due to nitrogen bonding with photoresist materials. Contact vias will be formed (see FIG. 2) which will extend to source or drain regions 110 and 112.

In accordance with an embodiment, before a photoresist layer is deposited on the substrate 100 and exposed, a treatment of plasma (e.g., oxygen plasma 114) is added to the substrate 100. The plasma treatment provides for oxidation of the SiN film. In testing, the Si/O ratio was about 1.8 times less in systems using the plasma oxygen treatment described above, versus systems not using the treatment. This difference results from the surface quality change of the SiN film. The raising of oxygen intensity as a result of plasma treatment is due to oxygen replacing nitrogen atoms. This is shown in element detection index measurements (Table 1, below).

TABLE 1

| | Counts per Second: | |
|---|---|---|
| | With Plasma Oxygen | Without Plasma Oxygen |
| Si | 1500 | 1700 |
| O | 325 | 200 |

Figure 2:
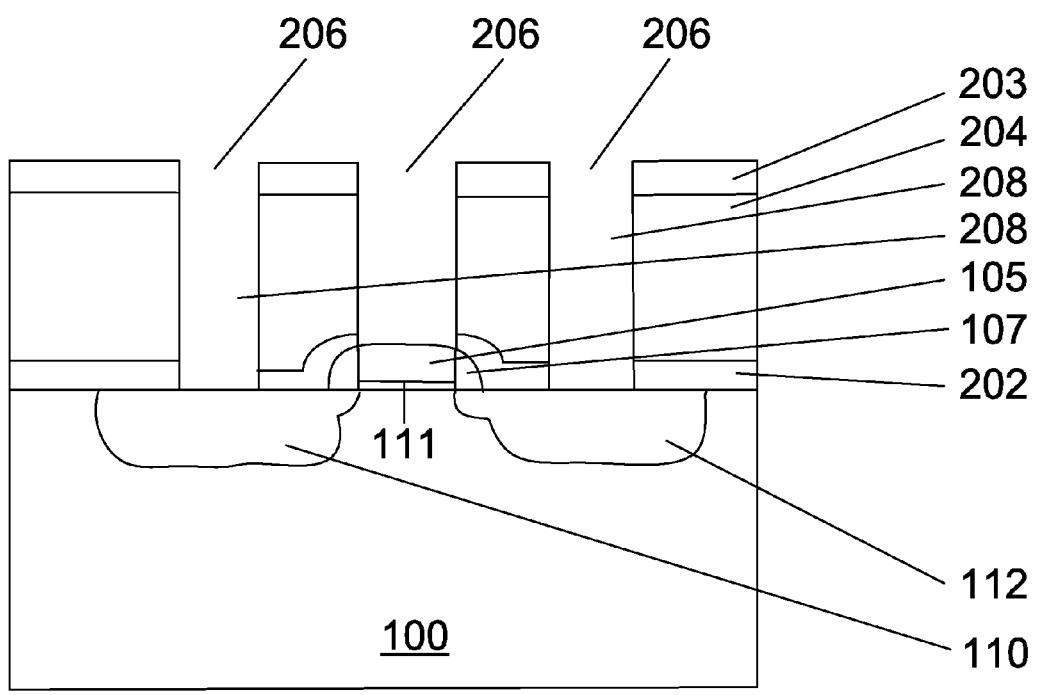
FIG. 2 is a cross-section of an embodiment, showing contact vias in cross section.

The layer of photoresist is then patterned with a desired pattern that will be transferred to the insulating material layer, e.g., for a pattern for at least one contact via. In FIG. 2, a layer of photoresist 203 is deposited over dielectric material layer 204, itself above etching stop layer 202, gate electrode 105 and spacers 107. The layer of photoresist is patterned Depending on whether a negative or positive photoresist is used, the photo exposure will render soluble the portions of the photoresist where contacts are to be formed, or leave those contact portions soluble while rendering the remaining photoresist insoluble. The soluble portions over the contact regions are then removed by a dry cleaning step (e.g., Gamma ash process), and/or a wet cleaning step (e.g., using Caro's process), exposing portions 206 of the material layer. These exposed portions are etched to form contact vias 208, extending to source or drain regions 110 and 112 of substrate 100.

Figure 3:
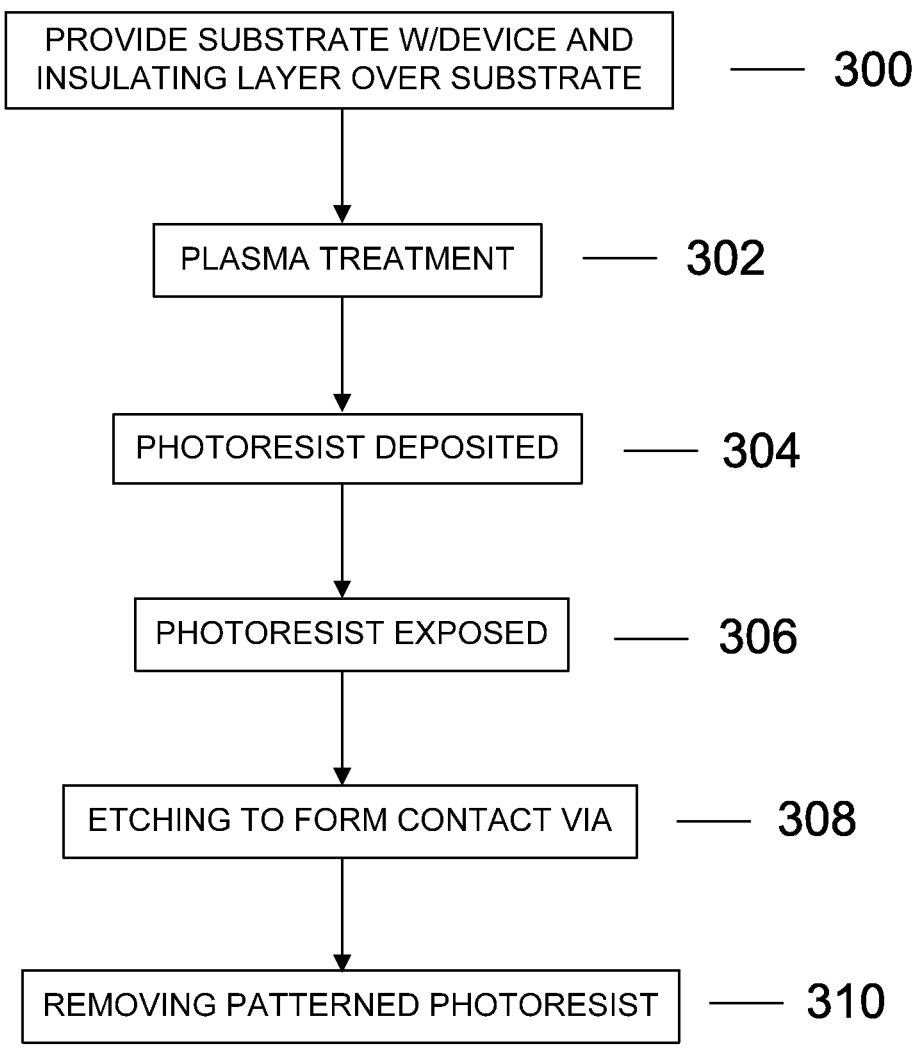
FIG. 3 is a flow chart of an embodiment.

In some embodiments (shown schematically in FIG. 3), a method of patterning a material layer of a semiconductor device includes: (a) treating a material layer above a semiconductor substrate with plasma oxygen (step 302); (b) depositing a layer of photoresist over a first surface of the material layer after the treating of the material layer (step 304); (c) patterning the layer of photoresist, thereby forming a patterned photoresist and exposing portions of the material layer (step 306); (d) etching the exposed portions of at least the material layer to form at least one contact via in the material layer extending to a source or drain region of a device at a surface of the substrate (step 308); and (e) removing the patterned photoresist from the first surface of the material layer (step 310). This is shown schematically in FIG. 3.

In some embodiments, a method of fabricating a semiconductor device includes: (a) providing a substrate; (b) depositing an insulating material layer over the substrate; (c) treating the insulating material layer with plasma oxygen; (d) depositing a layer of photoresist over a first surface of the insulating material layer after the treating of the material layer; (e) patterning the layer of photoresist, thereby forming a patterned photoresist, exposing portions of the insulating material layer; (f) etching the exposed portions of at least the insulating material layer to form at least one contact via in the insulating material layer extending to a source or drain region of a device at a surface of the substrate; and (g) removing the patterned photoresist from the first surface of the insulating material layer.

FIG. 2 shows an example of a device after etching the contact vias 206. In some embodiments, the material layer 204 comprises an SiN film, a passivation layer 202 is disposed beneath the material layer, and a bottom surface of the at least one contact via 206 extends at least to a top surface of the source drain regions 110, 112. Treating the material layer with the oxygen plasma prior to deposition of the photoresist 203 provides for oxidation of the SiN film 202. In some embodiments, the material layer 204 comprises a low-k dielectric material having a dielectric constant of about 3.5 or less, such as "SiLK™" dielectric from Dow Chemical Co. of Midland Mich., or "Black Diamond™" dielectric from Applied Materials Corp. of Santa Clara, Calif. The passivation layer 202 emits a contaminant while etching the exposed portions of at least the material layer 204. The treatment of the first surface (top surface) of the material layer 204 results in oxidation of the first surface. The contaminant emitted by the etch stop layer comprises $NH_x$. The etch stop layer comprises SiC, tetra ethyl oxysilane (TEOS), SiN, or combinations thereof. In embodiments, the at least one contact via further comprises sidewalls, and the contaminant causes formation of photoresist scum on the sidewalls and bottom surface of the at least one contact via. Treating the first surface of the material layer with plasma oxygen prevents the photoresist scum from remaining on the sidewalls and bottom surface of the at least one contact via. Various other variations of treatment, such as wet-cleaning or UV illumination (chemical or physical methods by various atoms doping to change film properties), could be effective as well.

Although the subject matter has been described in terms of exemplary embodiments, it is not limited thereto. Rather, the appended claims should be construed broadly, to include other variants and embodiments, which may be made by those skilled in the art.

What is claimed is:

1. A method comprising:
   (a) treating a material layer above a semiconductor substrate with plasma oxygen;
   (b) depositing a layer of photoresist over a first surface of the material layer after the treating of the material layer;
   (c) patterning the layer of photoresist, thereby forming a patterned photoresist and exposing portions of the material layer;
   (d) etching the exposed portions of at least the material layer to form at least one contact via in the material layer extending to a source or drain region or gate electrode of a device at a surface of the substrate; and
   (e) removing the patterned photoresist from the first surface of the material layer;

wherein an etch stop layer is disposed beneath the material layer, and a bottom surface of the at least one contact via extends at least to a top surface of the etch stop layer;
   the etch stop layer emits a contaminant while etching the exposed portions of at least the material layer, and treating the first surface of the material layer results in oxidation of the first surface;
   the at least one contact via further comprises sidewalls, and the contaminant causes formation of photoresist scum on the sidewalls and bottom surface of the at least one contact via; and treating the first surface of the material layer with plasma oxygen prevents the photoresist scum from remaining on the sidewalls and bottom surface of the at least one contact via.

2. The method according to claim 1, wherein the material layer comprises an SiN film.

3. The method according to claim 2, wherein treating the material layer provides for oxidation of the SiN film.

4. The method according to claim 1, wherein the material layer comprises a dielectric material having a dielectric constant of about 3.5 or less.

5. The method according to claim 1, wherein the contaminant emitted by the etch stop layer comprises $NH_x$.

6. The method according to claim 1, wherein the etch stop layer comprises SiC, tetra ethyl oxysilane (TEOS), SiN, or combinations thereof.

7. A method of fabricating a semiconductor device, the method comprising:
   (a) providing a substrate;
   (b) depositing an insulating material layer over the substrate;
   (c) treating the insulating material layer with plasma oxygen;
   (d) depositing a layer of photoresist over a first surface of the insulating material layer after the treating of the insulating material layer;
   (e) patterning the layer of photoresist, thereby forming a patterned photoresist, exposing portions of the insulating material layer;
   (f) etching the exposed portions of at least the insulating material layer to form at least one contact via in the insulating material layer extending to a source or drain region or gate electrode of a device at a surface of the substrate; and
   (g) removing the patterned photoresist from the first surface of the insulating material layer;

wherein an etch stop layer is disposed beneath the insulating material layer, and a bottom surface of the at least one contact via extends at least to a top surface of the etch stop layer;
   the etch stop layer emits a contaminant during etching the exposed portions of at least the material layer, and treating the first surface of the material layer results in surface oxidation;
   the at least one contact via further comprises sidewalls, and the contaminant causes formation of photoresist scum on the sidewalls and bottom surface of the at least one contact via; and treating the first surface of the material layer with plasma oxygen prevents the photoresist scum from remaining on the sidewalls and bottom surface of the at least one contact via.

8. The method according to claim 7, wherein the insulating material layer comprises an SiN film.

9. The method according to claim 8, wherein treating the insulating material layer provides for oxidation of the SiN film.

10. The method according to claim 7, wherein the insulating material layer comprises a dielectric material having a dielectric constant of about 3.5 or less.

11. The method according to claim 7, wherein the contaminant emitted by the etch stop layer comprises $NH_x$.

12. The method according to claim 7, wherein the etch stop layer comprises SiC, tetra ethyl oxysilane (TEOS), SiN, or combinations thereof.

* * * * *